US011788885B2

(12) United States Patent
Hasegawa et al.

(10) Patent No.: US 11,788,885 B2
(45) Date of Patent: Oct. 17, 2023

(54) TEST APPARATUS, TEST METHOD, AND COMPUTER-READABLE STORAGE MEDIUM

(71) Applicant: ADVANTEST CORPORATION, Tokyo (JP)

(72) Inventors: Kotaro Hasegawa, Saitama (JP); Kouji Miyauchi, Gunma (JP); Go Utamaru, Ibaraki (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 17/577,385

(22) Filed: Jan. 18, 2022

(65) Prior Publication Data
US 2022/0276090 A1    Sep. 1, 2022

(30) Foreign Application Priority Data
Feb. 26, 2021 (JP) ................. 2021-031196

(51) Int. Cl.
*G01J 1/44* (2006.01)
*G01J 1/42* (2006.01)

(52) U.S. Cl.
CPC ......... *G01J 1/44* (2013.01); *G01J 2001/4252* (2013.01)

(58) Field of Classification Search
CPC ........ G01J 1/44; G01J 2001/4252; G01J 1/10; G01J 1/42; G01J 3/12; Y02E 10/50;
(Continued)

(56) References Cited

U.S. PATENT DOCUMENTS 5,990,692 A    11/1999   Jeong
6,377,300 B1    4/2002   Morris et al.
(Continued)

FOREIGN PATENT DOCUMENTS

CN      1165401 A     11/1997
CN    101290340 A     10/2008
(Continued)

OTHER PUBLICATIONS

Office Action issued for counterpart Taiwanese Application No. 110148320, issued by the Taiwan Intellectual Property Office dated Sep. 6, 2022.
(Continued)

*Primary Examiner* — Kevin K Pyo

(57) ABSTRACT

A test apparatus includes: an electrical connection unit electrically connected to a terminal of each of a plurality of light emitting devices to be tested; a light source unit for collectively irradiating the plurality of light emitting devices with light; an electrical measurement unit for measuring a photoelectric signal obtained by photoelectrically converting the light irradiated from the light source unit by each light emitting device; a light emission control unit for causing at least one light emitting device to be subjected to light emission processing to emit light; a light measuring unit for measuring light emitted by the at least one light emitting device to be subjected to the light emission processing; and a determination unit determining a quality of each light emitting device on the basis of a measurement result of the electrical measurement unit and a measurement result of the light measuring unit.

20 Claims, 8 Drawing Sheets

(58) Field of Classification Search
CPC .............. G01R 31/2635; G01R 19/003; G01R 19/16528; G01R 19/16566; G01R 31/2879; G01R 31/2894
See application file for complete search history.

(56) References Cited

U.S. PATENT DOCUMENTS

| | | |
|---|---|---|
| 2004/0173732 A1 | 9/2004 | Rogers |
| 2004/0257358 A1 | 12/2004 | Okamoto |
| 2005/0194990 A1 | 9/2005 | Gothoskar |
| 2008/0218186 A1 | 9/2008 | Kooiman |
| 2010/0053601 A1 | 3/2010 | Osawa |
| 2010/0208261 A1 | 8/2010 | Sens |
| 2012/0136470 A1 | 5/2012 | Deans |
| 2012/0194211 A1 | 8/2012 | Osawa |
| 2013/0015331 A1 | 1/2013 | Birk |
| 2013/0021054 A1 | 1/2013 | Voltan |
| 2013/0201321 A1* | 8/2013 | Chao .................. G01J 1/0474 348/79 |
| 2013/0229188 A1 | 9/2013 | Seymour |
| 2013/0328487 A1 | 12/2013 | Yoshida |
| 2015/0015890 A1 | 1/2015 | Zheng |
| 2015/0019168 A1 | 1/2015 | Ohta et al. |
| 2015/0253388 A1 | 9/2015 | Masuda |
| 2016/0161294 A1* | 6/2016 | Ip ........................ G01J 3/465 250/578.1 |
| 2016/0161418 A1 | 6/2016 | Yeo |
| 2016/0306042 A1 | 10/2016 | Schrank |
| 2016/0329864 A1 | 11/2016 | Tu |
| 2017/0181384 A1 | 6/2017 | Zhu |
| 2017/0208655 A1 | 7/2017 | Lee |
| 2018/0254226 A1 | 9/2018 | Iguchi |
| 2018/0276812 A1 | 9/2018 | Kohyama |
| 2018/0352619 A1* | 12/2018 | Weber .................. H01L 25/167 |
| 2019/0004105 A1 | 1/2019 | Henley |
| 2019/0204235 A1 | 7/2019 | Nishizawa |
| 2019/0293570 A1 | 9/2019 | Kobayashi |
| 2020/0096389 A1* | 3/2020 | Ikemura ............... G01J 1/0488 |
| 2020/0111926 A1 | 4/2020 | Shr |
| 2020/0174377 A1 | 6/2020 | Osaka |
| 2020/0194616 A1 | 6/2020 | Henley |
| 2020/0371152 A1 | 11/2020 | Lin et al. |
| 2020/0379029 A1 | 12/2020 | Hasegawa |
| 2021/0050553 A1 | 2/2021 | Ogawa |
| 2021/0270752 A1 | 9/2021 | Suzuki |
| 2022/0037213 A1* | 2/2022 | Lee ........................ H01L 22/24 |
| 2022/0178837 A1 | 6/2022 | Nakamura |

FOREIGN PATENT DOCUMENTS

| | | |
|---|---|---|
| CN | 101583860 A | 11/2009 |
| CN | 102486520 A | 6/2012 |
| CN | 103364707 A | 10/2013 |
| CN | 205844396 U | 12/2016 |
| CN | 103620294 B | 2/2017 |
| CN | 210690739 U | 6/2020 |
| CN | 112151426 A | 12/2020 |
| EP | 2439517 A | 4/2012 |
| JP | S50103270 A | 8/1975 |
| JP | S59230143 A | 12/1984 |
| JP | S6161478 A | 3/1986 |
| JP | S62283684 A | 12/1987 |
| JP | 2004266250 A | 9/2004 |
| JP | 2008032704 A | 2/2005 |
| JP | 2006098054 A | 4/2006 |
| JP | 2006215211 A | 8/2006 |
| JP | 2007528129 A | 10/2007 |
| JP | 2010230568 A | 10/2010 |
| JP | 2012084883 A | 4/2012 |
| JP | 2012527662 A | 11/2012 |
| JP | 2013113635 A | 6/2013 |
| JP | 2015119344 A | 6/2015 |
| JP | 2016173385 A | 9/2016 |
| JP | 2017504959 A | 2/2017 |
| JP | 6249513 B1 | 12/2017 |
| JP | 2017223969 A | 12/2017 |
| JP | 6462843 B1 | 1/2019 |
| JP | 6489421 B2 | 3/2019 |
| JP | 2019040192 A | 3/2019 |
| JP | 2019507953 A | 3/2019 |
| JP | 2019075434 A | 5/2019 |
| JP | 2020167433 A | 10/2020 |
| JP | 2020201086 A | 12/2020 |
| KR | 101112193 B1 | 2/2012 |
| KR | 20170085334 A | 7/2017 |
| TW | 200422597 A | 11/2004 |
| TW | 200730845 A | 8/2007 |
| TW | 200925565 A | 6/2009 |
| TW | 201243310 A | 11/2012 |
| TW | 201316013 A | 4/2013 |
| TW | 201350351 A | 12/2013 |
| TW | 201500750 A | 1/2015 |
| TW | 201528867 A | 7/2015 |
| TW | 201539005 A | 10/2015 |
| TW | 201712353 A | 4/2017 |
| TW | 201928307 A | 7/2019 |
| TW | 201938381 A | 10/2019 |
| TW | 202015329 A | 4/2020 |
| TW | 202023069 A | 6/2020 |
| TW | 202029369 A | 8/2020 |
| TW | 202036838 A | 10/2020 |
| TW | 202045944 A | 12/2020 |
| WO | 2008059767 A1 | 5/2008 |
| WO | 2015045222 A1 | 4/2015 |
| WO | 2015107656 A1 | 7/2015 |
| WO | 2016147266 A1 | 9/2016 |
| WO | 2018062633 A1 | 4/2018 |
| WO | 2018236767 A2 | 12/2018 |

OTHER PUBLICATIONS

Office Action issued for counterpart Taiwanese Application 109107015, issued by the Taiwan Intellectual Property Office dated Aug. 27, 2020.

Office Action issued for counterpart Taiwanese Application 109107015, issued by the Taiwan Intellectual Property Office dated Nov. 30, 2020.

Office Action issued for counterpart Korean Application 10-2020-0025876, issued by the Korean Intellectual Property Office dated Jan. 7, 2021.

Notice of First Office Action for Patent Application No. 202010290804.5, issued by the National Intellectual Property Administration of the People's Republic of China dated Feb. 7, 2022.

Office Action issued for counterpart Taiwanese Application 110149281, issued by theTaiwan Intellectual Property Office dated Nov. 14, 2022.

Office Action issued for related Taiwanese Application 110148320, issued by the Taiwan Intellectual Property Office dated Jan. 16, 2023.

Office Action issued for related Japanese Application No. 2019-103155, issued by the Japanese Patent Office dated Nov. 22, 2022 (drafted on Nov. 11, 2022).

Office Action issued for related Taiwanese Application 110148130, issued by the Taiwan Intellectual Property Office dated Jan. 7, 2023.

Office Action issued for related Japanese Application No. 2021-003813, issued by the Japanese Patent dated Jun. 20, 2023 (drafted on Jun. 15, 2023).

Offie Action issued for related Taiwanese Application 111128100, issued by the Taiwan Intellectual Property Office dated Apr. 13, 2023.

Office Action issued for related Japanese Application No. 2021-145919, transmitted from the Japanese Patent Office dated Jul. 11, 2023 (drafted on Jul. 4, 2023).

Office Action issued for related Taiwanese Application No. 112116170, issued by the Taiwan Intellectual Property Office dated Jul. 11, 2023.

Office Action issued for related Japanese Application No. 2021-003813, transmitted from the Japanese Patent Office dated Aug. 8, 2023 (drafted on Aug. 1, 2023).

(56) References Cited

OTHER PUBLICATIONS

Office Action issued for related Japanese Application No. 2021-007928, transmitted from the Japanese Patent Office dated Aug. 22, 2023 (drafted on Aug. 16, 2023).

* cited by examiner

TEST APPARATUS, TEST METHOD, AND COMPUTER-READABLE STORAGE MEDIUM

The contents of the following Japanese patent application(s) are incorporated herein by reference:

NO. 2021-031196 filed in JP on Feb. 26, 2021

BACKGROUND

1. Technical Field

The present invention relates to a test apparatus, a test method, and a computer-readable storage medium.

2. Related Art

A method is known in which one of a pair of LEDs to be inspected is caused to emit light and the other is caused to receive the light, and optical characteristics of the LED are inspected using a current value of a current output by a photoelectric effect (see, for example, Patent Literatures 1 and 2).

CITATION LIST

Patent Document

Patent Literature 1: Japanese translation publication of PCT route patent application No. 2019-507953
Patent Literature 2: Japanese Patent Application Publication No. 2010-230568

DESCRIPTION OF EXEMPLARY EMBODIMENTS

Figure 1:
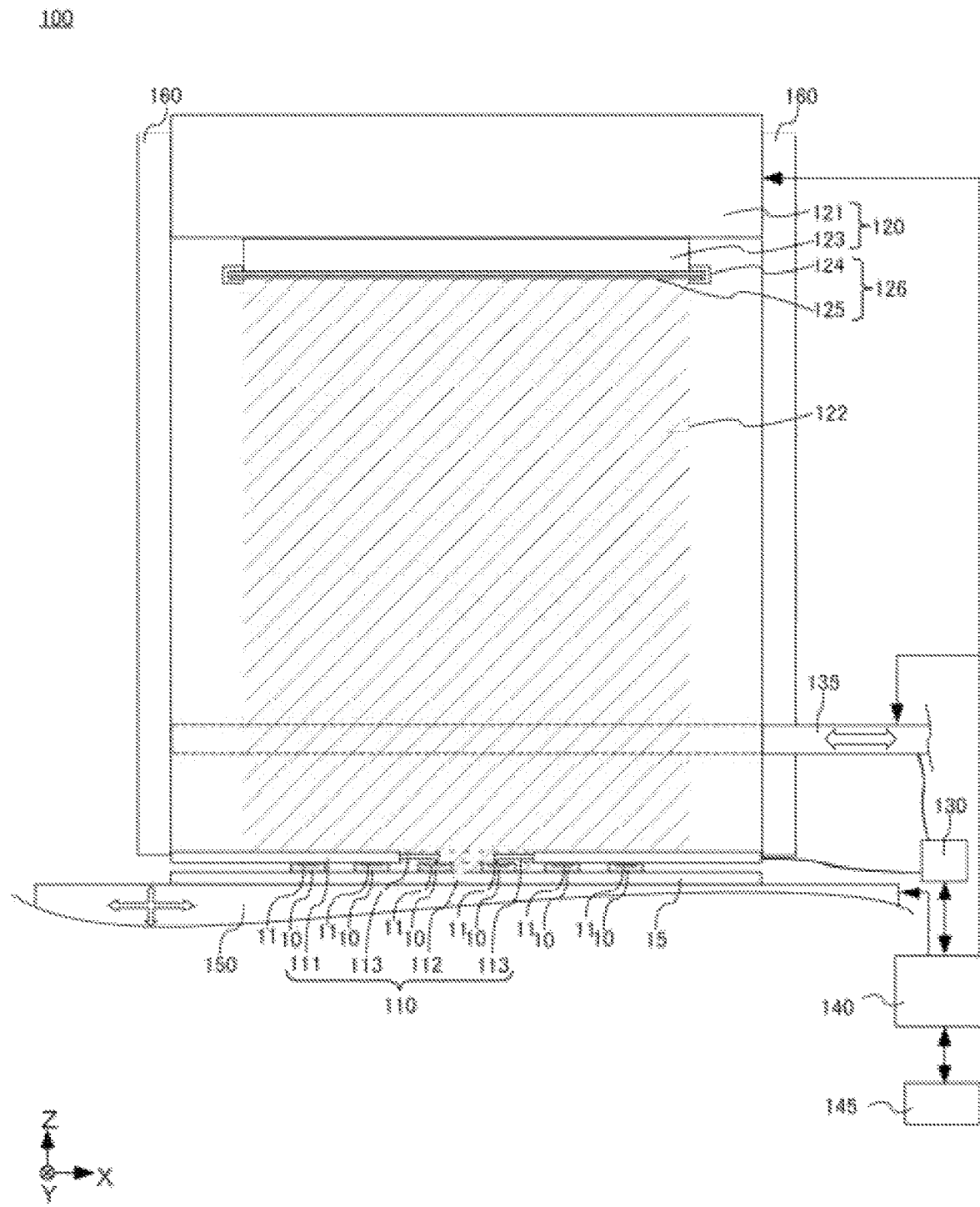
FIG. 1 is an example of an overall view illustrating an outline of a test apparatus 100 for testing a plurality of LEDs 10.

Hereinafter, the present invention will be described through embodiments of the invention, but the following embodiments do not limit the invention according to the claims. In addition, not all combinations of features described in the embodiments are essential to the solution of the invention. In the drawings, the same or similar parts are denoted by the same reference numerals, and redundant description may be omitted.

FIG. 1 is an example of an overall view illustrating an outline of a test apparatus 100 for testing a plurality of LEDs 10. In FIG. 1, an X axis having a +X direction in the right-hand direction facing the paper surface, a Z axis having a +Z direction in the upper direction facing the paper surface, and a Y axis having a +Y direction in the depth direction facing the paper surface are illustrated so as to be orthogonal to each other. Hereinafter, description may be made using these three axes.

The test apparatus 100 uses the photoelectric effect of the LED 10 to collectively test the optical characteristics of the plurality of LEDs 10 on the basis of the photoelectric signal output from the LED 10 irradiated with light. The test apparatus 100 includes an electrical connection unit 110, a light source unit 120, a temperature control unit 126, a measuring unit 130, a control unit 140, a storage unit 145, a placement unit 150, and a blocking unit 160. The test apparatus 100 may not include the temperature control unit 126, the storage unit 145, the placement unit 150, and the blocking unit 160.

The test apparatus 100 according to the present embodiment collectively tests the optical characteristics of a specific set of the plurality of LEDs 10 in the LED group in a state where the LED group in which the plurality of LEDs 10 are formed on a wafer 15, which is the LED wafer before the wiring by the backplane is provided, is placed on the placement unit 150. The LED 10 in the present embodiment is a micro LED having a dimension of 100 μm or less. Note that, instead of the micro LED, the LED 10 may be a mini LED having a dimension larger than 100 μm and equal to or less than 200 μm, an LED having a dimension larger than 200 μm, or another light emitting device such as an LD.

In addition, the plurality of LEDs 10 in the present embodiment are not electrically connected to each other on the wafer 15. Note that the plurality of LEDs 10 may be formed on a wafer provided with electric wiring or on a glass-based panel (PLP) having a substantially rectangular outer shape, and may be electrically connected to each other to be formed in units or cells. In this case, for example, the respective colors of RGB may be mixed by a technique of performing laser lift-off and transferring from the respective monochromatic wafers of RGB or a technique of dyeing or applying a fluorescent paint on a monochromatic wafer of any of RGB.

The electrical connection unit 110 is, for example, a probe card (probe substrate), and is electrically connected to a terminal 11 of each of the plurality of LEDs 10 to be tested. Note that, in the specification of the present application, in a case where the term "being electrically connected" is defined, it is intended to be electrically connected by contact or to be electrically connected in a non-contact manner. The electrical connection unit 110 in the present embodiment is electrically connected by being in contact with the terminal 11 of each of the plurality of LEDs 10, but may be electrically connected in a non-contact manner by, for example, electromagnetic induction or near field communication.

The electrical connection unit 110 in the present embodiment also sequentially switches a set of the plurality of LEDs 10 to be tested to which it connects from among the LED group placed on the placement unit 150 by the placement unit 150 moving with the LED group placed thereon. The electrical connection unit 110 in the present embodiment is disposed between the light source unit 120 and the plurality of LEDs 10, and includes a substrate 111 and a plurality of probes 113.

The substrate 111 includes an opening 112 that allows light from the light source unit 120 to pass toward the plurality of LEDs 10. In FIG. 1, the opening 112 is indicated by a broken line.

The plurality of probes 113 extend from the substrate 111 toward each of the plurality of LEDs 10 exposed in the opening 112 and contact the terminal 11 of each of the plurality of LEDs 10. The other end of each probe 113 opposite to the one end in contact with the terminal 11 is electrically connected to the electric wiring provided on the substrate 111. The plurality of electric wirings of the plurality of probes 113 extend from the side surface of the substrate 111 and are electrically connected to the measuring unit 130.

Note that it is preferable that the plurality of probes 113 have the same shape and dimension with each other and have the same distance, with each other, from the LEDs 10 they are in contact with so that the light reception amounts of each of the plurality of LEDs 10 are equal to each other. In addition, each of the plurality of probes 113 is preferably plated or colored so that light is not diffusely reflected on the surface of the probe 113.

The light source unit 120 collectively irradiates the plurality of LEDs 10 with light. The light source unit 120 in the present embodiment irradiates the plurality of LEDs with light in a reaction wavelength band of the plurality of LEDs. The light source unit 120 in the present embodiment includes a light source 121 and a lens unit 123.

The light source 121 emits light in the reaction wavelength band of the plurality of LEDs 10. The light source 121 may be, for example, a light source that emits light in a wide wavelength band, such as a xenon light source, or may be a light source that emits light in a narrow wavelength band, such as a laser light source. The light source 121 may include a plurality of laser light sources having wavelengths that are different from each other. Note that, in a case where the reaction wavelength and the light emission wavelength of the LED 10 are different from each other, even if the LED 10 is irradiated with light having the emission wavelength of the LED 10, photoelectric conversion does not appropriately occur due to the difference.

The lens unit 123 includes one or more lenses, is provided adjacent to the irradiation unit of the light source 121, and converts the diffused light irradiated from the light source 121 into parallel light 122. In FIG. 1, the parallel light 122 is indicated by hatching. The projection plane of the parallel light 122 in the XY plane covers at least the opening 112 of the substrate 111.

The temperature control unit 126 suppresses temperature rise of the plurality of LEDs 10 due to irradiation with the light. The temperature control unit 126 in the present embodiment includes a temperature suppression filter 125 and a filter holding unit 124. The temperature suppression filter 125 has high light transmittance and absorbs a heat ray of incident light. The filter holding unit 124 is provided adjacent to the lens unit 123 and holds the temperature suppression filter 125. Note that the temperature control unit 126 may further include a cooler that cools the heat absorbed by the temperature suppression filter 125.

In order to keep the temperatures of the plurality of LEDs 10 constant, the temperature control unit 126 may include, instead of or in addition to the above configuration, a temperature applying apparatus that adjusts the temperatures of the plurality of LEDs 10, an air blowing mechanism that blows air toward the plurality of LEDs 10, and the like. In a case where the air blowing mechanism is used, the temperature control unit 126 may further include a static electricity removing unit that prevents the plurality of LEDs 10 from being charged with static electricity when air is blown by the air blowing mechanism. The static electricity removing unit may be, for example, an ionizer. The above described temperature applying apparatus may be provided on the placement unit 150, the substrate 111, or the like in a manner contacting the plurality of LEDs 10. In addition, the above described air blowing mechanism may be provided on the side of the placement unit 150 so as not to contact the plurality of LEDs 10.

The measuring unit 130 measures the photoelectric signal which is obtained by photoelectrically converting the light irradiated by the light source unit 120 and output via the electrical connection unit 110 by each of the plurality of LEDs 10. The measuring unit 130 in the present embodiment measures the photoelectric signal from a set of the plurality of LEDs 10 to which the electrical connection unit 110 is sequentially connected.

More specifically, the measuring unit 130 in the present embodiment is connected to the electrical wiring electrically connected to each probe 113 of the electrical connection unit 110, and measures the current value of the current output from the set of the plurality of LEDs 10 switched to contact the plurality of probes 113 among the LED group placed on the placement unit 150. Note that the measuring unit 130 may measure a voltage value corresponding to the current value instead of the current value.

The measuring unit 130 according to the present embodiment further measures light emitted by at least one LED 10 to be subjected to light emission processing. More specifically, the measuring unit 130 in the present embodiment supplies a current to at least one LED 10 to be subjected to the light emission processing via the electrical connection unit 110. The measuring unit 130 includes a luminance meter 135, and measures the luminance of each LED 10 on the basis of a signal output from the luminance meter 135 that has received light from each LED 10 to be subjected to the light emission processing. The at least one LED 10 to be subjected to the light emission processing may be included in the plurality of LEDs 10 to be tested, or may not be included in the plurality of LEDs 10 to be tested. The LED 10 that is not included in the plurality of LEDs 10 to be tested may be, for example, the LED 10 that has been tested in the past, or may be an LED 10 that is not to be tested and prepared for defining a criterion for determining the quality of the LED 10.

As illustrated in FIG. 1, the luminance meter 135 in the present embodiment is slidable in a frame formed in a part of the blocking unit 160. The luminance meter 135 is controlled by the control unit 140, and can enter a space in the blocking unit 160 and face the LED 10 so as to receive light from the LED 10. The luminance meter 135 is controlled by the control unit 140 and exits the space in the blocking unit 160 at least while the LED group is irradiated with light by the light source unit 120.

Note that, instead of or in addition to the luminance meter 135, the measuring unit 130 may include an optical sensor such as a photodiode in addition to a chromaticity meter and an illuminance meter configured similarly to the luminance meter 135. In addition, the measuring unit 130 may measure chromaticity, a spectral spectrum, illuminance, and the like of the LED 10 instead of or in addition to the luminance of the LED 10. Note that luminance, chromaticity, a spectral spectrum, illuminance, and the like may be collectively referred to as optical characteristics. Note that the measuring unit 130 is an example of an electrical measurement unit and a light measuring unit.

The control unit 140 controls each component of the test apparatus 100. The control unit 140 in the present embodiment controls the light source 121 of the light source unit 120, thereby controlling the irradiation time, wavelength, and intensity of the parallel light 122 with which the plurality of LEDs 10 are collectively irradiated. The control unit 140 according to the present embodiment also controls the placement unit 150, thereby performing control to sequentially switch a set of the plurality of LEDs 10 to be tested from among the LED group placed on the placement unit 150. More specifically, the control unit 140 drives the placement unit 150 so that the probe 113 comes into contact with the terminal 11 of each LED 10 of the set. Note that the control unit 140 may grasp the position coordinates in the space of the plurality of probes 113 and the relative position between each of the plurality of probes 113 and each LED 10 on the placement unit 150 by referring to the reference data in the storage unit 145. The control unit 140 according to the present embodiment also controls the luminance meter 135 to enter the space inside the blocking unit 160 and to exit the space inside the blocking unit 160.

The control unit 140 further causes at least one light emitting device that is a target of the light emission processing to emit light. More specifically, the control unit 140 in the present embodiment sequentially supplies a current of a predetermined current value from the measuring unit 130 to one or more LEDs 10 to be subjected to the light emission processing, included in a set of the plurality of LEDs 10 switched to contact the plurality of probes 113, in the group of LED group placed on the placement unit 150, and causes each LED 10 to sequentially emit light. Note that, as described above, the LED group may be the same as the LED group to be tested, or may be another LED group, for example, an LED group not to be tested.

The control unit 140 further determines the quality of each of the plurality of LEDs 10 to be tested on the basis of the measurement result of the photoelectric signal and the measurement result of the light by the measuring unit 130. More specifically, the control unit 140 in the present embodiment calculates, for at least one LED 10 to be subjected to the light emission processing, the correlation between the photoelectric signal output by the at least one LED 10 and the luminance of the light emitted by the at least one LED 10 on the basis of the measurement results of the photoelectric signal and the light by the measuring unit 130. The control unit 140 stores data indicating the correlation in the storage unit 145.

Note that the correlation may be calculated by an external device, and in this case, the test apparatus 100 may acquire data indicating the correlation from the external device. In addition, the measurement of at least one LED 10 to be subjected to the light emission processing for calculating the correlation may be performed by an external device, and in this case, the test apparatus 100 may acquire data indicating the measurement result from the external device and calculate the correlation.

The control unit 140 according to the present embodiment further determines at least one LED 10 whose luminance is estimated to be out of the normal range among the plurality of LEDs 10 to be tested as defective on the basis of the measured photoelectric signal and the above correlation. Note that, as described above, the control unit 140 may estimate other optical characteristics such as chromaticity, a spectral spectrum, illuminance, and the like on the basis of the measured photoelectric signal, or may determine at least one LED 10 whose estimated optical characteristics are out of the normal range as defective.

Additionally or alternatively, the control unit 140 in the present embodiment may select at least one LED 10 to be subjected to the light emission processing among the plurality of LEDs 10 on the basis of the measurement result of the photoelectric signals of the plurality of LEDs 10 to be tested by the measuring unit 130. In this case, the number of LEDs 10 to be subjected to the light emission processing is smaller than the number of LEDs 10 to be measured for the photoelectric signal. In addition, the control unit 140 may select, as the at least one LED 10 to be subjected to the light emission processing, an LED 10 in which the photoelectric signal measured by the measuring unit 130 exhibits a variation equal to or greater than a predetermined threshold value. The control unit 140 refers to the storage unit 145 to perform sequence control of a plurality of configurations in the test apparatus 100 described above. Note that the control unit 140 serves as an example of a light emission control unit, a determination unit, and a correlation calculation unit.

The storage unit 145 stores the data indicating the above described correlation, the above threshold value, reference data for determining the quality of each of the plurality of LEDs 10, a determination result, reference data for moving the placement unit 150, a sequence and a program for controlling each configuration in the test apparatus 100, and the like. The storage unit 145 is referred to by the control unit 140.

The LED group is placed in the placement unit 150. The placement unit 150 in the illustrated example has a substantially circular outer shape in a plan view, but may have another outer shape. The placement unit 150 has a function of holding a vacuum chuck, an electrostatic chuck, and the like, and holds the wafer 15 of the placed LED group. The placement unit 150 moves two-dimensionally in the XY plane and moves up and down in the Z axis direction by being driven and controlled by the control unit 140. In FIG. 1, illustration of the placement unit 150 on the negative direction side of the Z axis will be omitted. In addition, in FIG. 1, the moving direction of the placement unit 150 and the moving direction of the luminance meter 135 are respectively indicated by white arrows. The same applies to the following drawings.

The blocking unit 160 blocks light other than the light from the light source unit 120. The surface of the blocking unit 160 in the present embodiment is entirely painted black to prevent irregular reflection of light on the surface. In addition, as illustrated in FIG. 1, the blocking unit 160 in the present embodiment is provided so as to be in close contact with each of the outer periphery of the light source 121 and the outer periphery of the substrate 111, and this configuration blocks light other than the light from the light source unit 120.

Note that the configuration of the luminance meter 135 described above is merely an example, and for example, the luminance meter 135 may be installed side by side with the light source 121 inside the blocking unit 160, that is, adjacent to the light source 121. In addition, for example, the luminance meter 135 may be fixed and installed at a position where light from the light source 121 is received inside the blocking unit 160. As another specific example, the luminance meter 135 may be configured to be replaceable with the light source unit 120 and the temperature control unit 126 inside the blocking unit 160. As another specific example, the luminance meter 135 may be fixed to the bottom surface located on the Z-axis positive direction side of the blocking tube that blocks external light, similarly to the blocking unit 160, independently of the light source unit 120, the temperature control unit 126, and the blocking unit 160. In this case, the wafer 15 may be conveyed by the placement unit 150 such that the plurality of LEDs 10 are arranged at positions facing the light receiving surface of the luminance meter 135.

Figure 2:
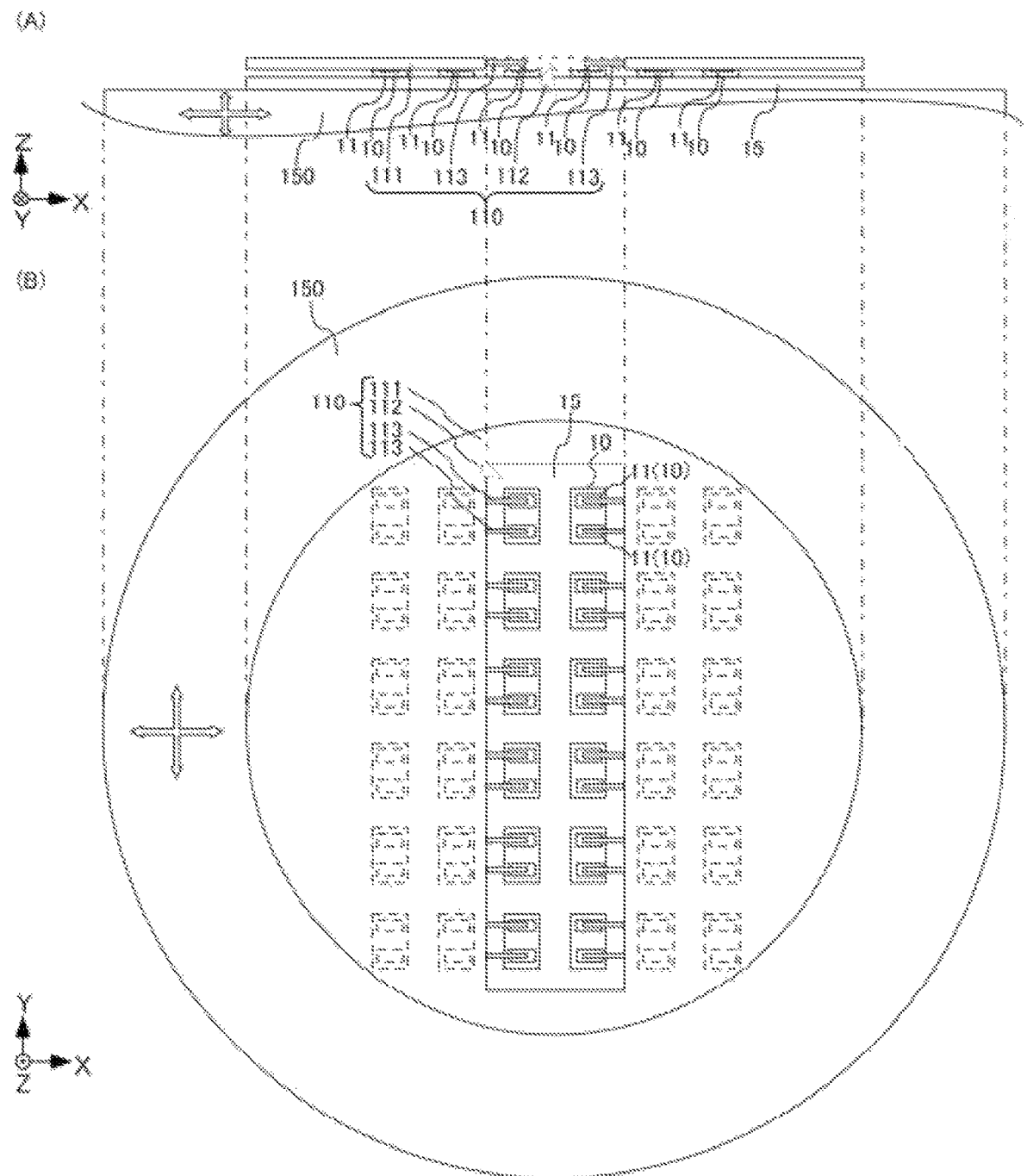
FIG. 2 is an example (A) of a side view and an example (B) of a plan view of a placement unit 150, an LED group placed on the placement unit 150, and an electrical connection unit 110 in a state where a plurality of probes 113 are in contact with a specific set of the plurality of LEDs 10 in the LED group.

FIG. 2 is an example (A) of a side view and an example (B) of a plan view of the placement unit 150, an LED group placed on the placement unit 150, and the electrical connection unit 110 in a state where a plurality of probes 113 are in contact with a specific set of the plurality of LEDs 10 in the LED group. (A) of FIG. 2 illustrates only the placement unit 150, the LED group, and the electrical connection unit 110 shown in FIG. 1 extracted. In (B) of FIG. 2, the plurality of LEDs 10 that cannot be visually recognized due to the substrate 111 in the LED group on the placement unit 150 are indicated by broken lines.

As illustrated in (B) of FIG. 2, two terminals 11 are formed on each LED 10 so as to be separated from each other in the Y axis direction. In addition, the plurality of LEDs 10 are placed in a state of being arranged in a matrix on the placement unit 150, and in the illustrated example, are arranged in a matrix of 6 columns in the X axis direction and 6 rows in the Y axis direction.

The opening 112 of the substrate 111 has a rectangular profile elongated in the Y axis direction. In the illustrated example, as a set of the plurality of LEDs 10 whose optical characteristics are collectively measured, 12 LEDs 10 of two columns in the X axis direction and six rows in the Y axis direction are exposed in the opening 112. One probe 113 of the electrical connection unit 110 is configured to be in contact with each of the plurality of terminals 11 located in the opening 112 of the substrate 111.

Figure 3:
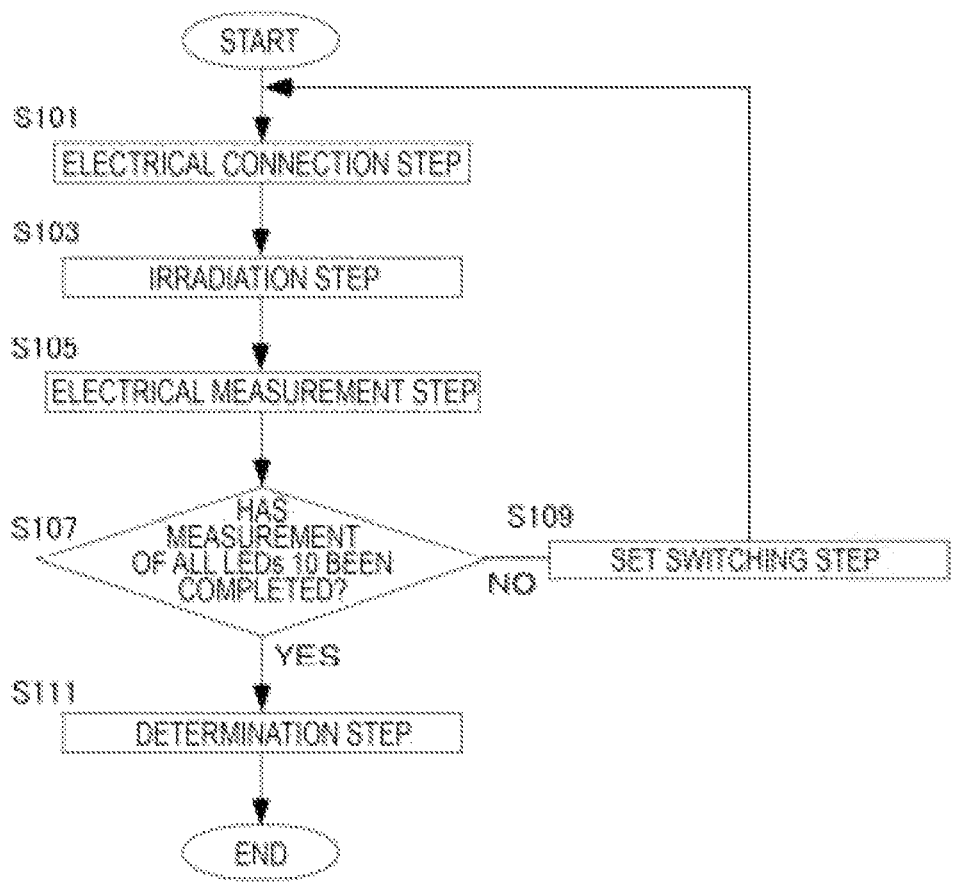
FIG. 3 is an example of a flowchart for explaining a flow of a test method by the test apparatus 100.

FIG. 3 is an example of a flowchart for explaining a flow of a test method by the test apparatus 100. The flow is started when, for example, a user performs an input for starting a test of the LED group with respect to the test apparatus 100 in a state where the LED group is placed on the placement unit 150.

The test apparatus 100 executes an electrical connection step of electrically connecting the electrical connection unit 110 to the terminal 11 of each of the plurality of LEDs 10 to be tested (Step S101). As a specific example, the control unit 140 outputs a command to the placement unit 150, and moves the placement unit 150 such that a set of the plurality of LEDs 10 to be tested among the LED groups on the placement unit 150 first comes into contact with the plurality of probes 113.

The test apparatus 100 executes an irradiation step of collectively irradiating the plurality of LEDs 10 with light (Step S103). As a specific example, the control unit 140 outputs a command to the light source unit 120, and irradiates a set of the plurality of LEDs 10 exposed in the opening 112 with the parallel light 122.

The test apparatus 100 executes an electrical measurement step of measuring the photoelectric signal which is obtained by photoelectrically converting the irradiated light and output via the electrical connection unit 110 by each of the plurality of LEDs 10 (Step S105). As a specific example, the control unit 140 issues a command to the measuring unit 130, causes the measuring unit 130 to measure the current value of the current output from the set of the plurality of LEDs 10 switched to contact the plurality of probes 113 among the LED group placed on the placement unit 150, and causes the measurement result to be output to the control unit 140. The control unit 140 stores the respective measurement results of the sets of the plurality of LEDs 10 in the storage unit 145.

The test apparatus 100 determines whether the measurement of all the LEDs 10 placed on the placement unit 150 has been completed (Step S107), and if not completed (Step S107: NO), executes a set switching step of switching a set of the plurality of LEDs 10 to be tested (Step S109), and returns to Step S101. As a specific example, the control unit 140 refers to the reference data in the storage unit 145, determines whether the measurement results of all the LEDs 10 placed on the placement unit 150 are stored, and if not stored, issues a command to the placement unit 150, and then moves the placement unit 150 so as to switch to a set of the plurality of LEDs 10 to be tested.

In a case where the measurement of all the LEDs 10 placed on the placement unit 150 has been completed in Step S107 (Step S107: YES), the test apparatus 100 executes a determination step of determining the quality of each of the plurality of LEDs 10 on the basis of the correlation between the photoelectric signal and the luminance and the measurement result of the above measurement stage (Step S111), and the flow ends. As a specific example, the control unit 140 refers to the reference data in the storage unit 145, and in a case where the measurement results of all the LEDs 10 placed on the placement unit 150 are stored, refers to the data indicating the correlation of the storage unit 145, and determines the quality of each of the plurality of LEDs 10 on the basis of the correlation and the measurement result.

As described above, the control unit 140 according to the present embodiment determines at least one LED 10 whose luminance is estimated to be out of the normal range among the plurality of LEDs 10 to be tested as defective on the basis of the measured photoelectric signal and the above correlation. As an example of the normal range described here, a range based on a statistic corresponding to the luminance of the light emitted by at least one LED 10 to be subjected to the light emission processing may be used.

More specifically, as an example of the normal range, a range based on the statistic of the luminance in the entire wafer 15 of the light emitted by each of the plurality of LEDs 10 to be subjected to the light emission processing on the placement unit 150 may be used, or a range based on the statistic of the luminance in the entire lot including the wafer 15 may be used. As an example of the statistic, a range within the average value ±1σ, a range within the average value ±2σ, or a range within the average value ±3σ of the luminance may be used.

In this case, the control unit 140 calculates the average value and a standard deviation a on the basis of the luminance, which is stored in the storage unit 145, of the light emitted by each of the plurality of LEDs 10 to be subjected to the light emission processing on the placement unit 150. In addition, in a case where there are a plurality of peaks in the luminance, the statistic of the luminance may be calculated using statistical processing capable of corresponding to the plurality of peaks without using the standard deviation.

Figure 4:
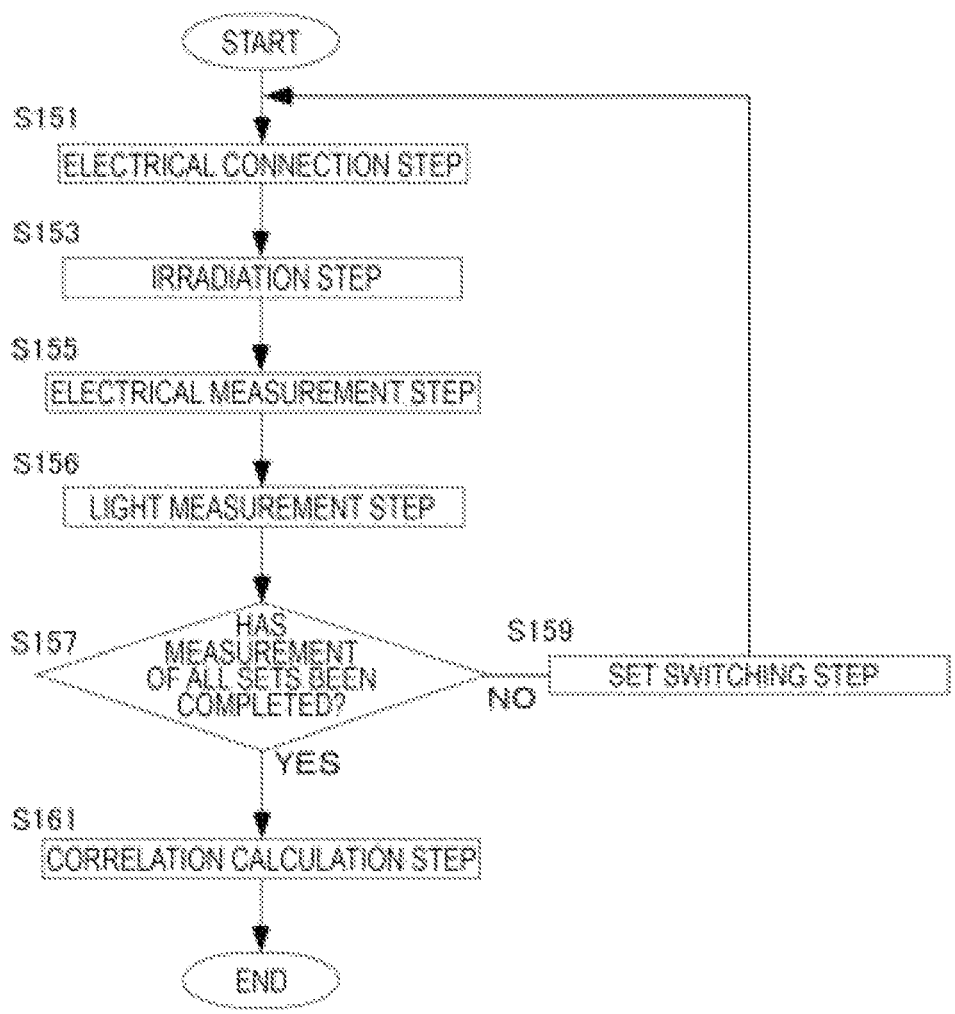
FIG. 4 is an example of a flowchart illustrating a flow of calculating a correlation between a photoelectric signal and luminance by the test apparatus 100.

FIG. 4 is an example of a flowchart for explaining a flow of calculating the correlation between the photoelectric signal and the luminance by the test apparatus 100. Before executing the flow of the test method illustrated in FIG. 3, the test apparatus 100 according to the present embodiment executes the flow illustrated in FIG. 4 in advance and calculates the correlation.

The flow is started when, for example, a user inputs to the test apparatus 100 to start the flow in a state in which the same number of LED groups of the plurality of LEDs 10 to be subjected to the light emission processing as the number of the plurality of LEDs 10 to be tested are placed on the placement unit 150. Note that the plurality of LEDs 10 to be subjected to the light emission processing are formed on the wafer 15 to constitute an LED group, similarly to the plurality of LEDs 10 to be tested. Further, as described above, at least one LED 10 to be subjected to the light emission processing may be included in the plurality of LEDs 10 to be tested, or may not be included in the plurality of LEDs 10 to be tested.

Respective steps S151 to S155 in the flow correspond to Steps S101 to S105 in the flow illustrated in FIG. 3, respectively, and redundant description will be omitted.

The test apparatus 100 executes a light measurement step of causing one or more LEDs 10 to be subjected to the light emission processing to emit light to measure the light (Step S156). Note that the light measurement step includes a light emission control step.

As a specific example, the control unit 140 issues a command to the measuring unit 130, sequentially supplies a current of a predetermined current value to one or more LEDs 10 to be subjected to the light emission processing, included in a set of the plurality of LEDs 10 switched to contact the plurality of probes 113 in the LED group to be subjected to the light emission processing placed on the placement unit 150, and causes each LED 10 to sequentially emit light. In accordance with the command from the control unit 140, the measuring unit 130 measures the luminance of each LED 10 on the basis of a signal output from the luminance meter 135 that has received the light from each LED 10 to be subjected to the light emission processing, and outputs a measurement result to the control unit 140. The control unit 140 stores each measurement result of one or more LEDs 10 to be subjected to the light emission processing in the storage unit 145.

The test apparatus 100 determines whether the measurement of all the sets to be subjected to the light emission processing placed on the placement unit 150 has been completed (Step S157), and if not completed (Step S157: NO), executes a set switching step of switching the sets of the plurality of LEDs 10 (Step S159), and returns to Step S151. As a specific example, the control unit 140 refers to the reference data in the storage unit 145, determines whether the measurement results of all the sets placed on the placement unit 150 are stored, and if not stored, issues a command to the placement unit 150 to move the placement unit 150 so as to switch to the next set of the plurality of LEDs 10.

In a case where the measurement of all the sets placed on the placement unit 150 is completed in Step S157 (Step S157: YES), the test apparatus 100 executes a correlation calculation step of calculating a correlation between the photoelectric signal output by the LED 10 and the luminance of the light emitted by the LED 10 on the basis of the measurement result of the electrical measurement step of Step S155 and the measurement result of the light measurement step of Step S156 for all the LEDs 10 to be subjected to the light emission processing (Step S161), and the flow ends. As a specific example, the control unit 140 refers to the reference data in the storage unit 145, and in a case where the measurement results of the light measurement step of all the LEDs 10 to be subjected to the light emission processing placed on the placement unit 150 are stored, the correlation between the photoelectric signal and the luminance is calculated on the basis of the statistic of the photoelectric signals and the luminance of all the LEDs 10 to be subjected to light emission processing.

Note that, in the flow illustrated in FIG. 4, the test apparatus 100 may execute the light measurement step in Step S156 before the irradiation step in Step S153. In addition, the test apparatus 100 may execute the correlation calculation step of Step S161 before Step S157 in the loop, that is, may calculate the correlation between the photoelectric signal and the luminance for each set. In addition, in order to calculate the correlation between the photoelectric signal and the luminance, the test apparatus 100 may execute the measurement of one of the photoelectric signal and the luminance for each set and then execute the measurement of the other of the photoelectric signal and the luminance for each set again.

Note that the test apparatus 100 may execute the flow of calculating the correlation between the photoelectric signal and the luminance illustrated in FIG. 4 within the flow of the test method by the test apparatus 100 illustrated in FIG. 3. In this case, at least one LED 10 to be subjected to the light emission processing is included in the plurality of LEDs 10 to be tested.

For example, the test apparatus 100 may execute the light measurement step of Step S156 of FIG. 4 before Step S103 or after Step S105 in the loop of Steps S101 to S109 of FIG. 3, and in this case, may further execute the correlation calculation step of Step S161 of FIG. 4 before Step S111 outside the loop. In addition, the test apparatus 100 may execute the correlation calculation step before Step S107 in the loop, that is, may calculate the correlation between the photoelectric signal and the luminance for each set.

In addition, for example, the test apparatus 100 may execute, outside the loop of Steps S101 to S109 of FIG. 3, for example, before or after the loop, steps other than Steps S153 and S155 in the loop of Steps S151 to S159 of FIG. 4. In this case, the correlation calculation step of Step S161 of FIG. 4 may be further executed before Step S111 outside the two loops. In addition, the test apparatus 100 may execute the correlation calculation step before Step S107 or Step S157 in the loop that is chronologically later of the two loops, that is, may calculate the correlation between the photoelectric signal and the luminance for each set on the condition that each measurement result of the photoelectric signal and the luminance is obtained.

Figure 5:
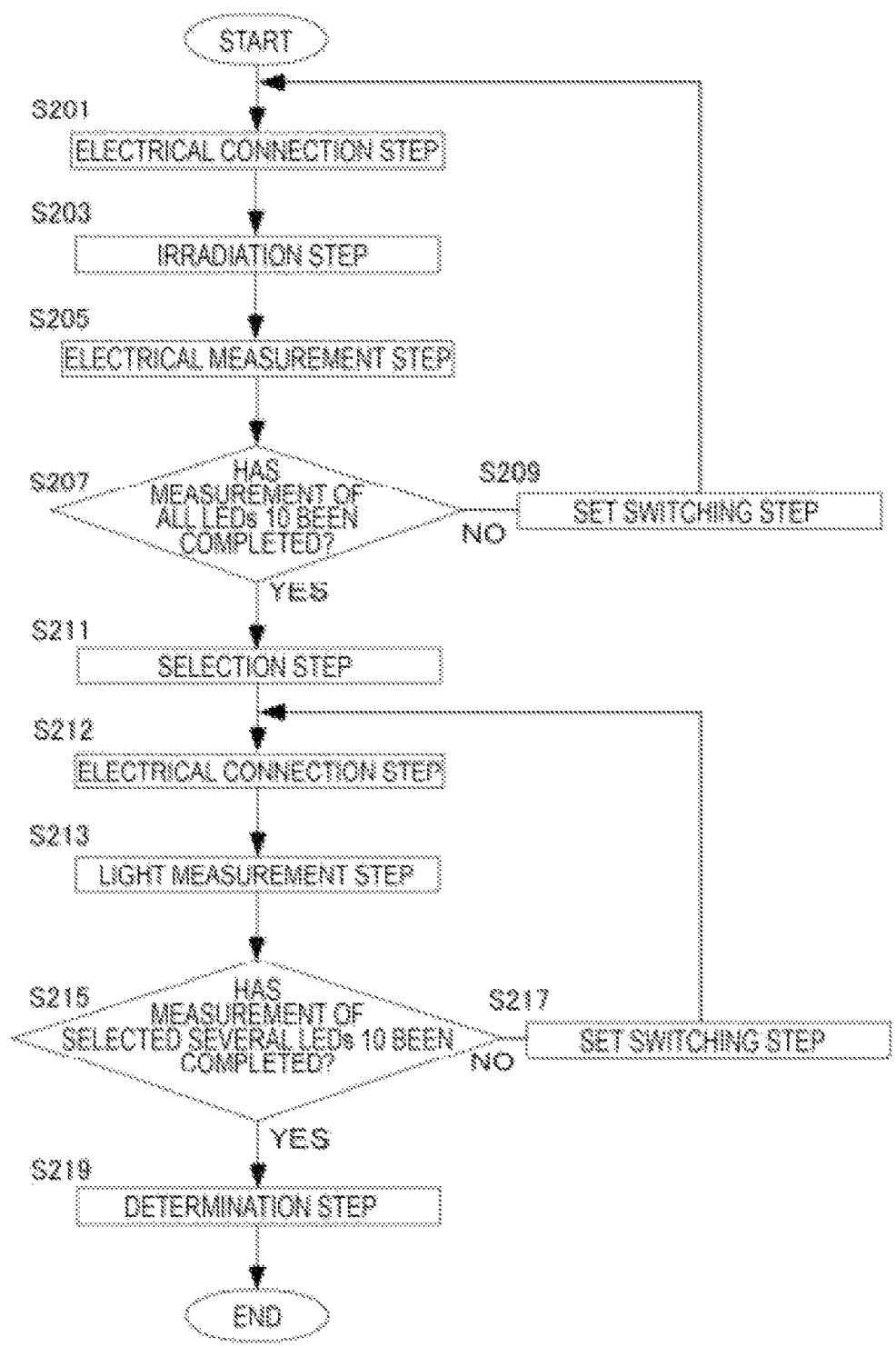
FIG. 5 is an example of a flowchart for explaining another flow of a test method by the test apparatus 100.

FIG. 5 is an example of a flowchart for explaining another flow of the test method by the test apparatus 100. Steps S201 to S209 in the flow respectively correspond to each of the Steps S101 to S109 in the flow illustrated in FIG. 3, and redundant description will be omitted.

In a case where the measurement of all the LEDs 10 placed on the placement unit 150 has been completed in Step S207 (Step S207: YES), the test apparatus 100 executes a selection step of selecting at least one LED 10 to be subjected to the light emission processing from among the plurality of LEDs 10 to be tested on the basis of the measurement result of the measurement step in Step S205 (Step S211). In Step S211, the test apparatus 100 according to the present embodiment selects several LEDs 10 to be subjected to the light emission processing.

As a specific example, the control unit 140 may select, as at least one LED 10 to be subjected to the light emission processing, the LED 10 in which the photoelectric signal measured by the measuring unit 130 exhibits a variation equal to or greater than a predetermined threshold value. For example, the control unit 140 may refer to the threshold value stored in the storage unit 145, and select the LED 10 in which the variation equal to or greater than the threshold value is found in the photoelectric signal on the assumption that the LED is defective, and additionally use the selected LED 10 to obtain supplementary data for analyzing a defect factor therefrom. In addition, the control unit 140 may use a specific threshold value among a plurality of different threshold values according to a statistic corresponding to the photoelectric signal measured by the measuring unit 130 for the plurality of LEDs 10. For example, the LED 10 to be subjected to the run-on test may be selected using a different threshold value according to the variation or distribution of the photoelectric signal of the entire wafer 15. Note that these threshold values stored in the storage unit 145 may be determined by, for example, ratings or the like.

In addition, the control unit 140 may calculate an average and a standard deviation (a) of the photoelectric signals measured by the measuring unit 130 for the plurality of LEDs 10 as a statistic, and select at least one LED 10 to be subjected to the light emission processing, the at least one LED having different sizes of the photoelectric signals from each other, on the basis of the average and the standard deviation. For example, one or more LEDs 10 may be selected from each group of the LEDs 10 that output different photoelectric signals, such as a group of the LEDs 10 that output the photoelectric signal of the average value, and a group of the LEDs 10 that output the photoelectric signals of the average value ±1a (a is a standard deviation).

In addition to the statistical processing using the average and the standard deviation, any statistical processing may be used. For example, in order to cope with a case where there are a plurality of peaks or a case where the peaks are biased in the statistical value of the photoelectric signal, a mathematical formula of the standard deviation may be made different, other algorithms or a combination of algorithms may be adopted, and these may be used depending on the characteristics of the LED 10. An example of another algorithm may be Good Die Bad Neighborhood (GDNB), cluster detection, or the like.

The test apparatus 100 executes the electrical connection step in the same manner as in Step S201 (Step S212), and executes the light measurement step of causing several LEDs 10 to be subjected to the light emission processing, selected in the selection step of Step S211, to sequentially emit light to measure the luminance (Step S213). More specifically, the test apparatus 100 sequentially causes the selected LED 10 to emit light for each set of the plurality of LEDs 10 to measure the luminance. Specific examples of Steps S212 and S213 may be the same as Steps S151 and S156 in FIG. 4, and redundant description will be omitted. Note that the light measurement step includes a light emission control step of causing at least one LED 10 to be subjected to the light emission processing to emit light.

The test apparatus 100 determines whether the measurement of the luminance has been completed for all of the several LEDs 10 selected in the selection step of Step S211 (Step S215). More specifically, the test apparatus 100 determines whether Steps S212 and S213 have been executed for a set including the selected LEDs 10.

In a case where the measurement of the luminance has not been completed for all of the several LEDs 10 selected in the selection step of Step S211 (Step S215: NO), the test apparatus 100 executes the set switching step as in Step S209 (Step S217), and returns to Step S212.

In Step S215, in a case where the measurement of the luminance has been completed for all of the several LEDs 10 selected in the selection step of Step S211 (Step S215: YES), the test apparatus 100 executes the determination step of determining the quality of each of the plurality of LEDs 10 on the basis of the measurement result in the electrical measurement step of Step S205 and the measurement result in the light measurement step of Step S213 (Step S219), and the flow ends. As a specific example, the control unit 140 may determine the quality of the selected LEDs 10 on the basis of a measurement result obtained by measuring light emitted by the LED 10 selected to be subjected to the light emission processing. More specifically, the control unit 140 refers to the reference data in the storage unit 145, and in a case where the measurement results of the light measurement step of the several LEDs 10 placed on the placement unit 150 are stored, determines the quality of the several LEDs 10 on the basis of the photoelectric signals and the luminance of the several LEDs 10. In this case, the control unit 140 may determine that the remaining LEDs 10 that are not selected at the selection step of Step S211 are good.

The control unit 140 may determine the selected LED 10 as defective in a case where the luminance of the light emitted by the selected LED 10 is out of the normal range. The control unit 140 may use, as the normal range, a range based on a statistic corresponding to the luminance of the light emitted by at least one LED 10 to be subjected to the light emission processing.

Note that the test apparatus 100 may execute Steps S211 and S213 before Step S207 in the loop of Steps S201 to S209 of the flow illustrated in FIG. 5, that is, may execute the electrical measurement step, the selection step, and the light measurement step for each set. In this case, in a case where the measurement of all the LEDs 10 placed on the placement unit 150 has been completed in Step S207 (Step S207: YES), the test apparatus 100 executes the determination step of Step S219 and ends the flow.

Note that, instead of executing the determination step of Step S219 after the measurement of the luminance is completed for all of the several LEDs 10 selected in the selection step of Step S211, the test apparatus 100 may execute the determination step of Step S219 before Step S215, that is, may determine the quality of the LEDs 10 selected for each set.

As a comparative example with the test method by the test apparatus 100 of the present embodiment, for example, a test method of optical characteristics of LEDs is conceivable, in which a plurality of LEDs arranged on a wafer are sequentially turned on one by one, and light is received by an image sensor, a spectral luminance meter, or the like to determine whether light is correctly emitted.

In a case where the optical characteristics of the plurality of LEDs are collectively measured using the test method of the comparative example, light emitted from each of the plurality of adjacent LEDs interferes with each other, a defective LED having a relatively deteriorated optical characteristic cannot be correctly identified, and an image sensor or the like becomes very expensive for performing image recognition in a wide range with high accuracy. In particular, in a case where a plurality of micro LEDs are tested, the problem becomes remarkable.

On the other hand, according to the test apparatus 100 of the present embodiment, the electrical connection unit 110 is electrically connected to the terminal 11 of each of the plurality of LEDs 10 to be tested, the plurality of LEDs 10 are collectively irradiated with light, and the photoelectric signal obtained by photoelectrically converting the irradiated light and output via the electrical connection unit 110 by each of the plurality of LEDs 10 is measured. Further, according to the test apparatus 100, the quality of each of the plurality of LEDs 10 is determined on the basis of the measurement results of the plurality of LEDs 10. As a result, the test apparatus 100 can not only shorten the processing time by simultaneously measuring the photoelectric signals of the plurality of LEDs 10, but also can correctly identify a defective LED 10 having deteriorated optical characteristics by determining the quality of the LED 10 using the photoelectric signals measured without being affected by the measurement of the optical characteristics of the other LEDs 10. In addition, according to the test apparatus 100, the number of LEDs 10 to be simultaneously measured can be easily expanded.

In addition, according to the test apparatus 100 of the present embodiment, for example, in a case where the flow of the test method illustrated in FIG. 3 is executed, the quality of each of the plurality of LEDs 10 is determined on the basis of the measurement value of the photoelectric signal output by each of the plurality of LEDs 10 to be tested and the correlation between the photoelectric signal and the luminance measured for the plurality of LEDs 10 to be subjected to the light emission processing. As a result, the test apparatus 100 can directly assume the luminance of each of the plurality of LEDs 10 to be tested, and can determine whether the luminance satisfies a predetermined criterion, for example. Thus, the measurement accuracy can be improved as compared with the case of determining the quality only on the basis of the measurement value of the photoelectric signal output by each of the plurality of LEDs 10 to be tested. In addition, by calculating the correlation in advance, the test apparatus 100 can be used to improve the test process repeated thereafter on the basis of the correlation.

In addition, according to the test apparatus 100 of the present embodiment, for example, in a case where another flow of the test method illustrated in FIG. 5 is executed, several LEDs 10 to be subjected to the next measurement are selected from among the plurality of LEDs 10 on the basis of the measurement result of the photoelectric signal output by each of the plurality of LEDs 10 to be tested, and then the luminance is measured by causing the several LEDs 10 to emit light, and the quality of each of the plurality of LEDs 10 is determined on the basis of the measurement result of the photoelectric signal and the measurement result of the luminance. As described above, by reducing the number of LEDs 10 and measuring the luminance in a run-on manner, the test apparatus 100 can not only improve the measurement accuracy as compared with the case of determining the quality only on the basis of the photoelectric signal, but also shorten the entire test time as compared with the case of measuring all the LEDs 10 in a run-on manner.

According to the test apparatus 100 of the present embodiment, the plurality of probes 113 and the substrate 111 used for measuring the optical characteristics of the plurality of LEDs 10 can also be shared for measurement of the electrical characteristics of the plurality of LEDs 10, for example, a VI test using an LED tester. According to the test apparatus 100 of the present embodiment, for the other configurations except for the light source unit 120 and the blocking unit 160, that is, for the electrical connection unit 110, the measuring unit 130, the luminance meter 135, the control unit 140, the storage unit 145, and the placement unit 150, those used for testing devices other than optical devices such as the LED group can be used.

In the above embodiment, in the case of calculating the correlation between the photoelectric signal and the luminance, the test apparatus 100 has been described as executing the measurement of the photoelectric signal and the luminance for the plurality of LEDs 10 to be subjected to the light emission processing as many as the number of the plurality of LEDs 10 to be tested. However, the number of the plurality of LEDs 10 to be subjected to the light emission processing may be adjusted according to the accuracy required for the correlation. For example, the test apparatus 100 can shorten the execution time of the flow illustrated in FIG. 4 by reducing the number of the plurality of LEDs 10 to be subjected to the light emission processing.

In the above embodiment, in a case where unevenness occurs in the intensity of light in the irradiation region of light irradiated from the light source 121 of the test apparatus 100 to the plurality of LEDs 10, the photoelectric signal and the luminance of the LED 10 to be subjected to the light emission processing disposed at the same position as the LED 10 to be tested on the placement unit 150 may be used in order to calculate the above correlation. More specifically, the control unit 140 of the test apparatus 100 acquires the photoelectric signals, which are output by the plurality of LEDs 10 disposed at the same position among sets of the plurality of LEDs 10, in the measurement results which are obtained by performing a plurality of measurements by the measuring unit 130 while sequentially changing the set of the plurality of LEDs 10 from the LED group to be subjected to the light emission processing. For example, the control unit 140 acquires the current value of the current output from the target LED using, as the target LED, the LEDs 10 disposed at a position at the same row and the same column, that is, the same position as each other before and after changing the set, among the LED groups to be subjected to the light emission processing arranged in a matrix of 6 columns in the X axis direction and 6 rows in the Y axis direction on the placement unit 150 illustrated in FIG. 2.

The control unit 140 further acquires the luminance of the light, which is emitted from the plurality of target LEDs disposed at the same position as each other among the sets, in the measurement results of the light obtained by performing a plurality of measurements the measuring unit 130 while sequentially changing the set of the plurality of LEDs 10 from the LED group to be subjected to the light emission processing. The control unit 140 further calculates a correlation between the photoelectric signals and the luminance measured for the plurality of target LEDs.

The control unit 140 further determines, as defective, at least one test LED in which the luminance obtained by converting the photoelectric signals measured for the plurality of LEDs 10 disposed at the same position as the above position before and after changing the set among the plurality of LEDs 10 to be tested on the basis of the correlation calculated for the target LED disposed at the above position is out of the normal range. In this case, as the normal range, a range based on the statistic corresponding to the luminance of the light emitted by the plurality of target LEDs disposed at the corresponding position is used. As a result, the test apparatus 100 can determine the quality of each of the plurality of LEDs 10 regardless of the variation in the intensity of light with which the light source unit 120 irradiates each position of the plurality of LEDs 10.

In the above embodiment, the LED 10 to be tested may have a characteristic of not appropriately emitting light in a case where the current value of the supplied current is low, that is, not appropriately performing photoelectric conversion in a case where the irradiated light is weak, and on the other hand, appropriately emitting light when the current value is high. Therefore, for example, in a case where the test is performed on the plurality of LEDs 10 in which it is predetermined that the current having a specific current value flows, the test apparatus 100 may determine the LED 10 in which the photoelectric signal is out of the normal range and the luminance is out of the normal range as defective. As described above, if the LED 10 to be tested has only accidentally failed to appropriately perform photoelectric conversion at the current value used for the test but appropriately emits light in a case where the current of the specific current value is supplied, the LED 10 may be regarded as not being defective. In this case, the test apparatus 100 first determines the suitability of photoelectric conversion for the plurality of LEDs 10 to be tested, thereby reducing the number of LEDs 10 to be measured for luminance, chromaticity, spectral spectrum, and the like, and shortening the execution time of the test.

In the above embodiment, the plurality of LEDs 10 have been described as having a configuration in which the terminals 11 are on the light emitting surface side. Alternatively, the plurality of LEDs 10 may have terminals 11 on the opposite side of the light emitting surface. The plurality of probes 113 may have different lengths depending on whether each terminal 11 of the plurality of LEDs 10 is located on the light emitting surface side or on the opposite side of the light emitting surface.

In the above embodiment, the configuration has been described in which the placement unit 150 on which the LED group is placed is moved so that the position coordinates of the plurality of probes 113 of the electrical connection unit 110 and the position coordinates of the plurality of LEDs 10 of the LED group coincide with each other in the XY plane, and then the placement unit 150 is moved up and down to bring the plurality of terminals 11 of the plurality of LEDs 10 into contact with the plurality of probes 113. Alternatively, the plurality of terminals 11 of the plurality of LEDs 10 may be brought into contact with the plurality of probes 113 by moving the substrate 111 up and down after the movement in the XY plane described above.

In the above embodiment, the placement unit 150 has been described as having a substantially circular outer shape. Alternatively, for example, in a case where an LED group in which a plurality of LEDs 10 are formed on a glass-based panel (PLP) having a substantially rectangular outer shape in which electric wiring are formed is placed thereon, the placement unit 150 may have a substantially rectangular outer shape in correspondence with the outer shape of the LED group.

Figure 6:
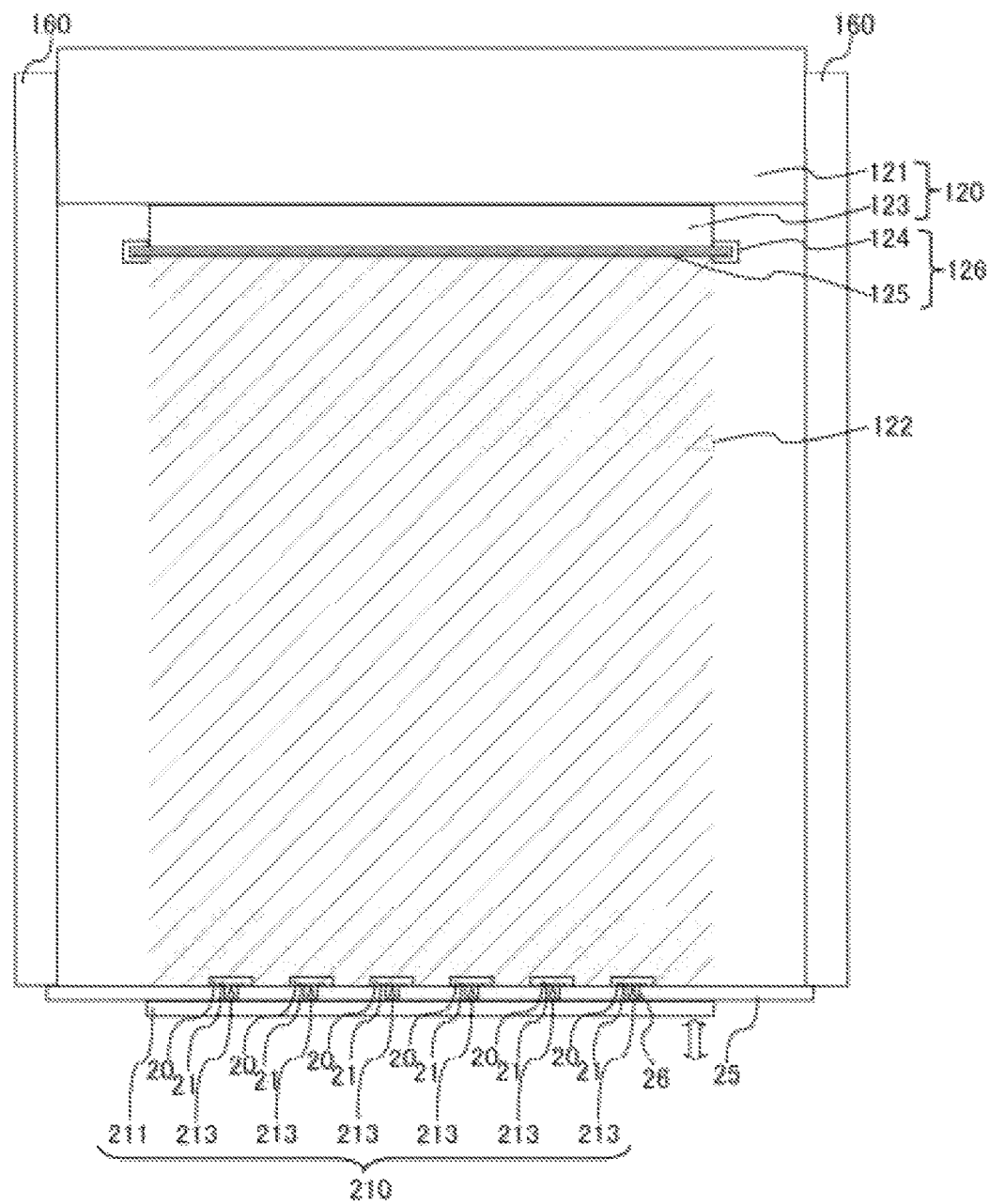
FIG. 6 is an example of an overall view illustrating an outline of a test apparatus 200 for testing a plurality of LEDs 20.

FIG. 6 is an example of an overall view illustrating an outline of a test apparatus 200 for testing a plurality of LEDs 20. In the description of the embodiment illustrated in FIG. 6, the same configurations as those of the embodiment described with reference to FIG. 1 to FIG. 5 are denoted by the corresponding reference numerals, and redundant description will be omitted. However, in FIG. 6, illustration of the measuring unit 130, the luminance meter 135, the control unit 140, the storage unit 145, and the placement unit 150 of the test apparatus 100 described with reference to FIG. 1 to FIG. 5 will be omitted for the purpose of simply clarifying the description. The same applies to the drawings of the embodiments described below, and redundant description will be omitted.

In the embodiment described with reference to FIG. 1 to FIG. 5, the electrical connection unit 110 has been described as having a configuration in which the electrical connection unit 110 is disposed between the light source unit 120 and the plurality of LEDs 10, and includes the substrate 111 and the plurality of probes 113 provided in the opening 112 of the substrate 111. In the embodiment illustrated in FIG. 6, instead, an electrical connection unit 210 is disposed such that the plurality of LEDs 20 are located between the light source unit 120 and the electrical connection unit 210, and includes a substrate 211 and a plurality of probes 213 extending from the substrate 211 toward each of the plurality of LEDs 20 and contacting terminals 21 of each of the plurality of LEDs 20.

In the embodiment illustrated in FIG. 6, the LED group is a surface emitting type in which the light emitting surfaces of the plurality of LEDs 20 do not face a wafer 25, each terminal 21 of the plurality of LEDs 20 faces the wafer 25, and the wafer 25 is formed with a plurality of vias 26 extending in the Z axis direction at the position of each terminal 21. In such a case, the electrical connection unit 210 may bring the plurality of probes 213 into contact with the respective terminals 21 of the plurality of LEDs 20 from the negative direction side of the Z axis of the wafer 25 through the plurality of vias 26 formed in the wafer 25.

In the electrical connection unit 210 of the embodiment illustrated in FIG. 6, the substrate 211 may not have the opening 112 of the electrical connection unit 110 in the embodiment described with reference to FIG. 1 to FIG. 5, and the plurality of probes 213 may not extend in the XY plane. As illustrated in FIG. 6, the plurality of probes 213 may extend in the Z axis direction toward the terminal 21 of each LED 20 so as to form a mountain shape together with the substrate 211. The same applies to the embodiments described below, and redundant description will be omitted.

In the embodiment illustrated in FIG. 6, the processing of sequentially switching the sets of the plurality of LEDs 10 to be exposed in the opening 112 of the substrate 111 used in the test apparatus 100 is not executed. The test apparatus 200 according to the present embodiment uses the electrical connection unit 210 that can be electrically connected to all the LEDs 20 without blocking the light from the light source unit 120. As a result, the test apparatus 200 can collectively irradiate all the LEDs 20 with light and measure the photoelectric signal output from each LED 20. That is, the test apparatus 200 collectively executes the electrical connection step, the irradiation step, the electrical measurement step, and the determination step for all the LEDs 20.

Figure 7:
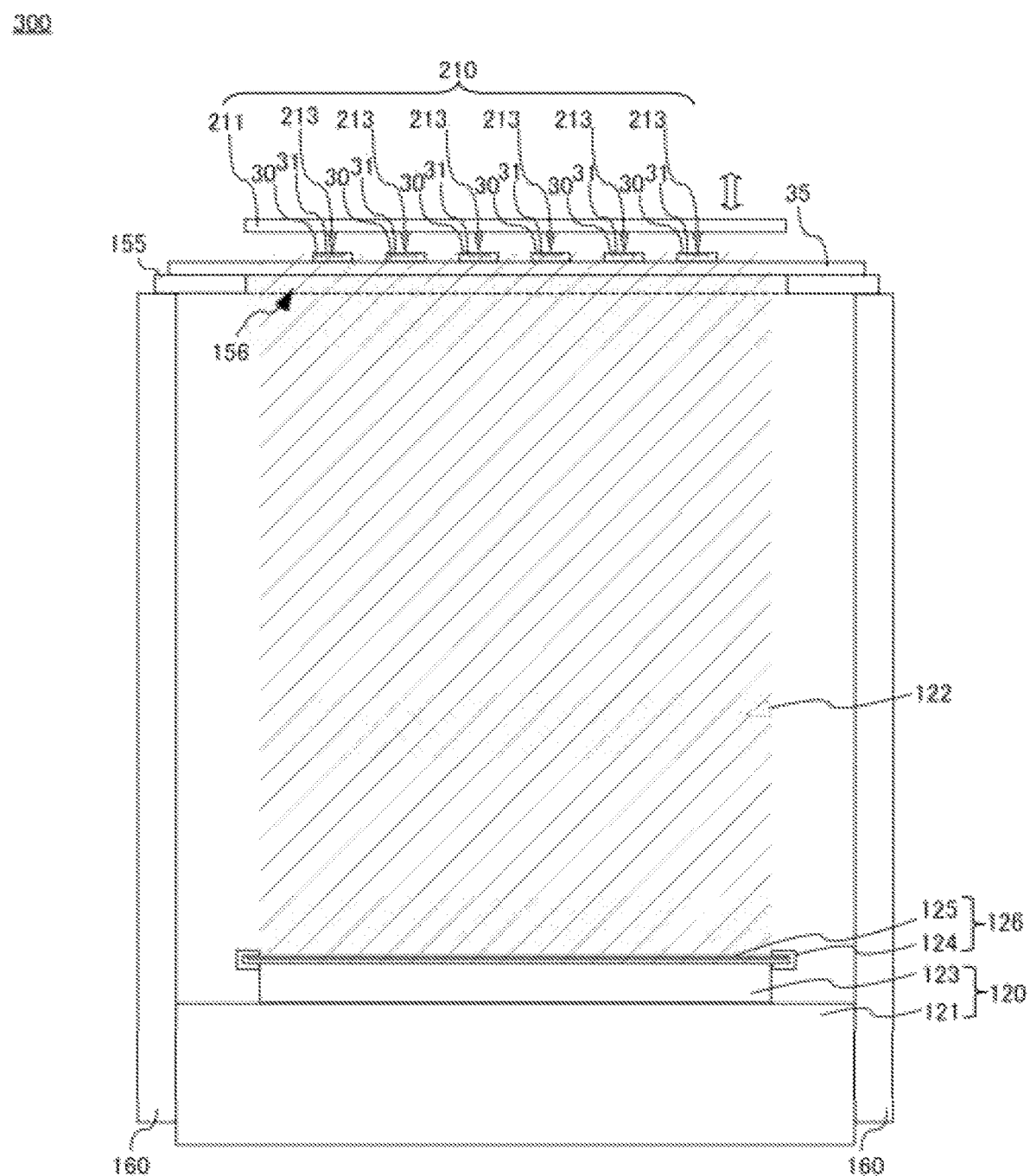
FIG. 7 is an example of an overall view illustrating an outline of a test apparatus 300 for testing a plurality of LEDs 30.

The test apparatus 200 according to the present embodiment calculates the correlation between the photoelectric signal and the luminance before executing the flow of the test method illustrated in FIG. 7. The test apparatus 200 collectively executes the electrical connection step, the irradiation step, the electrical measurement step, the light measurement step, and the correlation calculation step for all the LEDs 20.

Note that the test apparatus 200 may execute the light measurement step before the irradiation step. In addition, the test apparatus 200 may execute the processing of calculating the correlation between the photoelectric signal and the luminance in a flow of testing the plurality of LEDs 20 to be tested. In this case, at least one LED 20 to be subjected to the light emission processing is included in the plurality of LEDs 20 to be tested. For example, the test apparatus 200 may execute the light measurement step before the irradiation step or after the electrical measurement step. In this case, the test apparatus 200 may further execute the correlation calculation step before the determination step.

Note that the test apparatus 200 according to the present embodiment may collectively execute the electrical connection step, the irradiation step, the electrical measurement step, the selection step, the light measurement step, and the determination step for all the LEDs 20.

The test apparatus 200 according to the embodiment described above has the same effect as the test apparatus 100 according to the embodiment described with reference to FIG. 1 to FIG. 5. Since the test apparatus 200 includes the electrical connection unit 210 having a configuration in which the plurality of probes 213 extend in the Z axis direction from one surface of the substrate 211 having no opening toward the terminal 21 of each LED 20, the number of probes 213 can be increased and the number of LEDs 20 to be measured at the same time can be increased as compared with the case of using the electrical connection unit 110 having the plurality of probes 113 extending toward the terminal 11 of the LED 20 exposed in the opening 112 of the substrate 111 according to the embodiment described with reference to FIG. 1 to FIG. 5.

Note that, in the present embodiment, the placement unit 150 on which the LED group is placed is moved so that the position coordinates of the plurality of probes 113 of the electrical connection unit 110 and the position coordinates of the plurality of LEDs 20 of the LED group coincide with each other in the XY plane, and then the substrate 211 of the electrical connection unit 210 is moved up and down as indicated by a white arrow in each drawing, whereby the plurality of terminals 21 of the plurality of LEDs 20 may be brought into contact with the plurality of probes 213.

In the present embodiment, the configuration illustrated in FIG. 6 may be reversed in the Z axis direction, and thus the plurality of LEDs 20 may be irradiated, from the negative direction of the Z axis, with the parallel light 122 from the light source unit 120.

In the present embodiment, in order to prevent the wafer 25 from being deformed due to the pressing by the plurality of probes 213 of the electrical connection unit 210, a support plate that transmits light, such as glass, may be interposed between the wafer 25 and the blocking unit 160. In a case where the plurality of LEDs 20 are located on the light source unit 120 side as illustrated in FIG. 6, it is preferable that the support plate is configured not to contact the plurality of LEDs 20 so as not to destroy the plurality of LEDs 20 formed on the wafer 25. Any of the points described above is similar in the embodiment described below, and redundant description will be omitted.

FIG. 7 is an example of an overall view illustrating an outline of a test apparatus 300 for testing a plurality of LEDs 30. Unlike the test apparatuses 100 and 200, the test apparatus 300 has a posture in which the entire test apparatus 200 is inverted in the Z axis direction. In the embodiment illustrated in FIG. 7, similarly to the embodiment illustrated in FIG. 6, an electrical connection unit 210 is disposed such that the plurality of LEDs 30 are located between the light source unit 120 and the electrical connection unit 210, and includes a substrate 211 and a plurality of probes 213 extending from the substrate 211 toward each of the plurality of LEDs 30 and contacting terminals 31 of each of the plurality of LEDs 30. In the embodiment illustrated in FIG. 7, the LED group is a back-side emission type in which the light emitting surfaces of the plurality of LEDs 30 face a wafer 35, and the wafer 35 transmits light. Each terminal 31 of the plurality of LEDs 30 does not face the wafer 35. Note that, in the LED group of a back-side emission type as in the present embodiment, the plurality of LEDs 30 and the wafer 35 on which the plurality of LEDs 30 are mounted may be collectively referred to as a wafer.

In such a configuration, the electrical connection unit 210 brings the plurality of probes 213 into contact with the respective terminals 31 of the plurality of LEDs 30 from the positive direction side of the Z axis of the wafer 35. In the embodiment illustrated in FIG. 7, unlike a placement unit 150, the placement unit 155 includes a through hole 156 at the center of the XY plane so as not to block the light emitted by the plurality of LEDs 30 and transmitted through the wafer 35, and holds the wafer 35 around the through hole 156. The test apparatus 300 of the embodiment illustrated in FIG. 7 has the same effect as the test apparatuses 100 and 200 of the plurality of embodiments described with reference to FIG. 1 to FIG. 6.

In the plurality of embodiments described above, in a case where the LED group has a configuration in which the plurality of LEDs are formed on a glass-based panel (PLP) having a substantially rectangular outer shape on which electric wirings are formed, the electrical connection unit may have a configuration in which the probes are brought into contact with the respective wirings in the row direction and the column direction arranged on the two side surfaces of the panel.

Various embodiments of the present invention may also be described with reference to flowcharts and block diagrams, where the blocks may represent (1) a step of processing in which an operation is executed or (2) a section of an apparatus that is responsible for executing the operation. Certain steps and sections may be implemented by dedicated circuitry, programmable circuitry provided with computer readable instructions stored on a computer readable medium, and/or a processor provided with computer readable instructions stored on a computer readable medium. The dedicated circuitry may include digital and/or analog hardware circuits, and may include integrated circuits (ICs) and/or discrete circuits. The programmable circuitry may include reconfigurable hardware circuits including memory elements such as logic AND, logic OR, logic XOR, logic NAND, logic NOR, and other logic operations, flip-flops, registers, field programmable gate arrays (FPGA), programmable logic arrays (PLA), and the like.

The computer readable medium may include any tangible device capable of storing instructions to be executed by a suitable device, so that the computer readable medium having the instructions stored therein will have a product including instructions that can be executed to create means for executing the operations specified in flowcharts or block diagrams. Examples of the computer readable medium may include an electronic storage medium, a magnetic storage medium, an optical storage medium, an electromagnetic storage medium, a semiconductor storage medium, and the like. More specific examples of the computer readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disk, a memory stick, an integrated circuit card, and the like.

The computer readable instructions may include source code or object code written in any combination of one or more programming languages, including assembler instructions, instruction-set-architecture (ISA) instructions, machine instructions, machine-dependent instructions, microcode, firmware instructions, state-setting data, or an object oriented programming language such as Smalltalk (registered trademark), JAVA (registered trademark), C++, or the like, and conventional procedural programming languages such as the "C" programming language or similar programming languages.

The computer readable instructions may be provided for a processor or programmable circuitry of a general purpose computer, special purpose computer, or other programmable data processing apparatuses locally or via a wide area network (WAN) such as a local area network (LAN), the Internet, or the like, and execute the computer readable instructions to create means for executing the operations specified in flowcharts or block diagrams. Examples of the processor include a computer processor, a processing unit, a microprocessor, a digital signal processor, a controller, a microcontroller, and the like.

Figure 8:
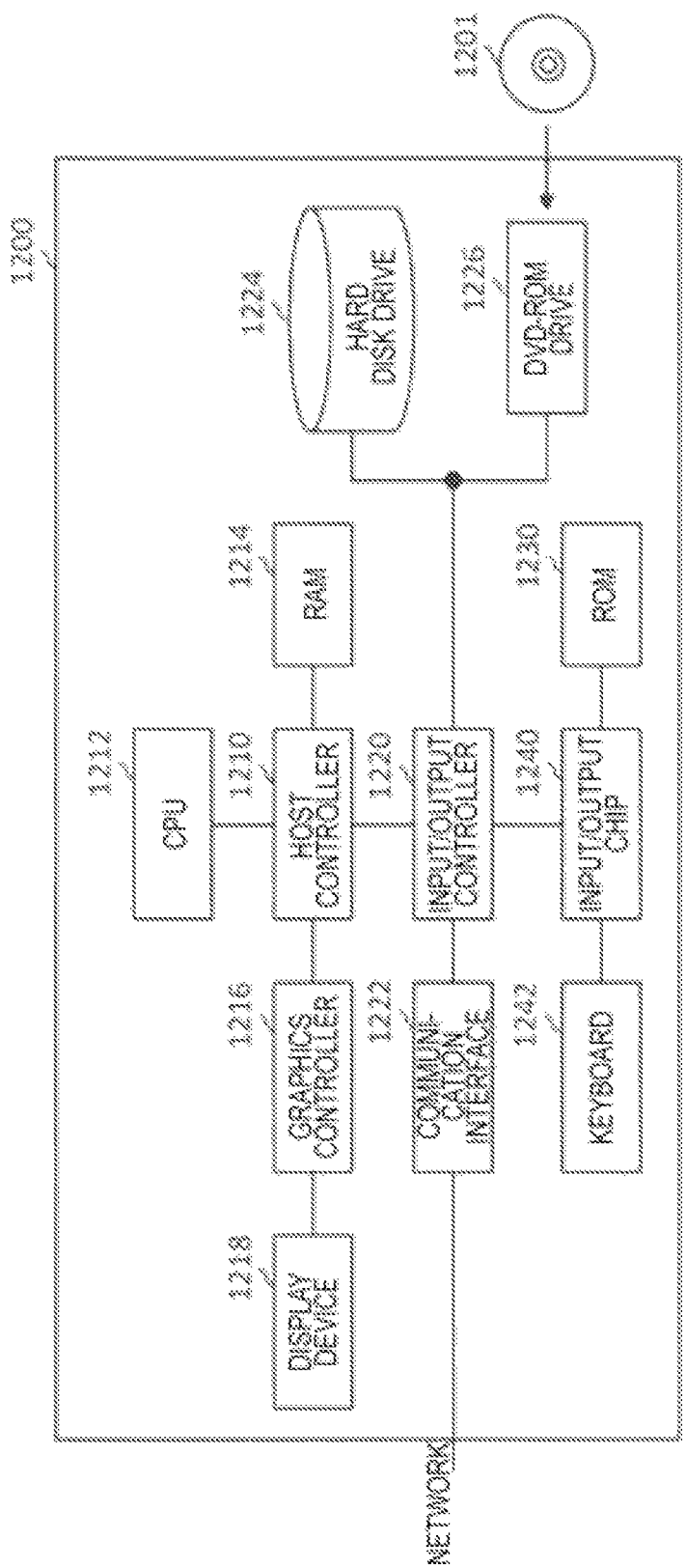
FIG. 8 is a diagram illustrating an example of a computer 1200 in which a plurality of aspects of the present invention may be embodied in whole or in part.

FIG. 8 illustrates an example of a computer 1200 in which a plurality of aspects of the present invention may be embodied in whole or in part. A program installed in the computer 1200 can cause the computer 1200 to function as an operation associated with the apparatus according to the embodiment of the present invention or one or more "units" of the apparatus, or execute the operation or the one or more "units", and/or cause the computer 1200 to execute a process according to the embodiment of the present invention or a step of the processing. Such programs may be executed by a CPU 1212 to cause the computer 1200 to execute certain operations associated with some or all of the blocks in the flowcharts and block diagrams described in the present specification.

The computer 1200 according to the present embodiment includes the CPU 1212, a RAM 1214, a graphic controller 1216, and a display device 1218, which are interconnected by a host controller 1210. The computer 1200 also includes input/output units such as a communication interface 1222, a hard disk drive 1224, a DVD-ROM drive 1226, and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates according to programs stored in the ROM 1230 and the RAM 1214, thereby controlling each unit. The graphics controller 1216 acquires image data generated by the CPU 1212 in a frame buffer or the like provided in the RAM 1214 or in the graphics controller 1216 itself, such that the image data is displayed on the display device 1218.

The communications interface 1222 communicates with other electronic devices via a network. The hard disk drive 1224 stores programs and data used by the CPU 1212 in the computer 1200. The DVD-ROM drive 1226 reads program or data from the DVD-ROM 1201 and provides the programs or data to the hard disk drive 1224 via the RAM 1214. The IC card drive reads programs and data from the IC card and/or writes the programs and data to the IC card.

The ROM 1230 stores a boot program and the like, therein, executed by the computer 1200 at the time of activation and/or a program depending on hardware of the computer 1200. The input/output chip 1240 may also connect various input/output units to the input/output controller 1220 via a parallel port, a serial port, a keyboard port, a mouse port, or the like.

The program is provided by a computer-readable storage medium such as a DVD-ROM 1201 or an IC card. The program is read from a computer-readable storage medium, installed in the hard disk drive 1224, the RAM 1214, or the ROM 1230 that are also examples of the computer-readable storage medium, and executed by the CPU 1212. The information processing described in these programs is read by the computer 1200 and provides cooperation between the programs and various types of hardware resources described above. The apparatus or method may be configured by implementing operation or processing of information according to the use of the computer 1200.

For example, in a case where communication is executed between the computer 1200 and an external device, the CPU 1212 may perform a communication program loaded in the RAM 1214 and instruct the communication interface 1222 to execute communication processing on the basis of a process described in the communication program. Under the control of the CPU 1212, the communication interface 1222 reads transmission data stored in a transmission buffer area provided in a recording medium such as the RAM 1214, the hard disk drive 1224, the DVD-ROM 1201, or the IC card, transmits the read transmission data to the network, or writes reception data received from the network in a reception buffer area or the like provided on the recording medium.

In addition, the CPU 1212 may cause the RAM 1214 to read all or a necessary part of a file or database stored in an external recording medium such as the hard disk drive 1224, the DVD-ROM drive 1226 (DVD-ROM 1201), the IC card, or the like, and may execute various types of processing on data on the RAM 1214. Next, the CPU 1212 may write back the processed data to the external recording medium.

Various types of information such as various types of programs, data, tables, and databases may be stored in a recording medium in order to be subjected to information processing. The CPU 1212 may execute various types of processing on the data read from the RAM 1214, including various types of operations, information processing, conditional determination, conditional branching, unconditional branching, information retrieval/replacement, and the like, which are described throughout the present disclosure and specified by a command sequence of a program, and writes back the results to the RAM 1214. Further, the CPU 1212 may retrieve information in a file, a database, or the like in the recording medium. For example, in a case where a plurality of entries each having the attribute value of a first attribute associated with the attribute value of a second attribute is stored in the recording medium, the CPU 1212 may retrieve an entry matching the condition in which the attribute value of the first attribute is specified from among the plurality of entries, read the attribute value of the second attribute stored in the entry, and thereby acquire the attribute value of the second attribute associated with the first attribute satisfying the predetermined condition.

The programs or software modules according to the above description may be stored in a computer-readable storage medium on or near the computer 1200. In addition, a recording medium such as a hard disk or a RAM provided in a server system connected to a dedicated communication network or the Internet can be used as a computer-readable storage medium, thereby providing a program to the computer 1200 via the network.

While the embodiments of the present invention have been described, the technical scope of the invention is not limited to the above described embodiments. It is apparent to those skilled in the art that various modifications or improvements can be made to the above described embodiments. In addition, the matters described for a specific embodiment can be applied to other embodiments within a scope not technically contradictory. In addition, each component may have a similar feature to other component having the same name and different reference signs. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10, 20, 30: LED
11, 21, 31: terminal
15, 25, 35: wafer
100, 200, 300: test apparatus
110, 210: electrical connection unit
111, 211: substrate
112: opening
113, 213: probe
120: light source unit
121: light source
122: parallel light
123: lens unit
124: filter holding unit
125: temperature suppression filter
126: temperature control unit
130: measuring unit
135: luminance meter
140: control unit
145: storage unit
150, 155: placement unit
156: through hole
160: blocking unit
1200: computer
1201: DVD-ROM
1210: host controller
1212: CPU
1214: RAM
1216: graphic controller
1218: display device
1220: input/output controller
1222: communication interface
1224: hard disk drive
1226: DVD-ROM drive
1230: ROM
1240: input/output chip
1242: keyboard

What is claimed is:

1. A test apparatus comprising:
an electrical connection unit configured to be electrically connected to a terminal of each of a plurality of light emitting devices to be tested;
a light source unit configured to collectively irradiate the plurality of light emitting devices with light;
an electrical measurement unit configured to measure a photoelectric signal which is obtained by photoelectrically converting the light irradiated from the light source unit by each of the plurality of light emitting devices;
a light emission control unit configured to cause at least one light emitting device to be subjected to light emission processing to emit light;
a light measuring unit configured to measure light emitted by the at least one light emitting device to be subjected to the light emission processing; and
a determination unit configured to determine a quality of each of the plurality of light emitting devices on a basis of both a measurement result of the electrical measurement unit and a measurement result of the light measuring unit, wherein the light source unit is configured to collectively irradiate the plurality of light emitting devices with light external from the plurality of light emitting devices.

2. The test apparatus according to claim 1, further comprising: a correlation calculation unit configured to calculate a correlation between a photoelectric signal output by the at least one light emitting device and an optical characteristic that is at least one of luminance, chromaticity, and a spectral spectrum of light emitted by the at least one light emitting device, on a basis of measurement results of the electrical measurement unit and the light measuring unit for the at least one light emitting device to be subjected to the light emission processing.

3. The test apparatus according to claim 2, wherein the determination unit is configured to determine at least one light emitting device of which the optical characteristic is estimated to be out of a normal range as defective on a basis of the measured photoelectric signal and the correlation among the plurality of light emitting devices.

4. The test apparatus according to claim 3, wherein the determination unit is configured to use, as the normal range, a range based on a statistic according to the optical characteristic of light emitted by the at least one light emitting device to be subjected to the light emission processing.

5. The test apparatus according to claim 1, wherein the light emission control unit is configured to select the at least one light emitting device to be subjected to the light emission processing from the plurality of light emitting devices to be tested on a basis of a measurement result of the electrical measurement unit.

6. The test apparatus according to claim 5, wherein the light emission control unit is configured to select, as the at least one light emitting device to be subjected to the light emission processing, a light emitting device in which the photoelectric signal measured by the electrical measurement unit exhibits a variation equal to or greater than a predetermined threshold value.

7. The test apparatus according to claim 6, wherein the light emission control unit is configured to use a specific threshold value of a plurality of the threshold values that are different according to a statistic corresponding to the photoelectric signal measured by the electrical measurement unit for the plurality of light emitting devices.

8. The test apparatus according to claim 5, wherein the light emission control unit is configured to calculate an average and a standard deviation of the photoelectric signals measured by the electrical measurement unit for the plurality of light emitting devices, and to select the at least one light emitting device to be subjected to the light emission processing, the at least one light emitting device having different sizes of the photoelectric signals from each other, on a basis of the average and the standard deviation.

9. The test apparatus according to claim 5, wherein the determination unit is configured to determine a quality of the selected light emitting device on a basis of a measurement result of the light measuring unit obtained by measuring light emitted by the light emitting device selected to be subjected to the light emission processing.

10. The test apparatus according to claim 6, wherein the determination unit is configured to determine a quality of the selected light emitting device on a basis of a measurement result of the light measuring unit obtained by measuring light emitted by the light emitting device selected to be subjected to the light emission processing.

11. The test apparatus according to claim 7, wherein the determination unit is configured to determine a quality of the selected light emitting device on a basis of a measurement result of the light measuring unit obtained by measuring light emitted by the light emitting device selected to be subjected to the light emission processing.

12. The test apparatus according to claim 8, wherein the determination unit is configured to determine a quality of the selected light emitting device on a basis of a measurement result of the light measuring unit obtained by measuring light emitted by the light emitting device selected to be subjected to the light emission processing.

13. The test apparatus according to claim 9, wherein the determination unit is configured to determine the selected light emitting device as defective in a case where an optical characteristic that is at least one of luminance, chromaticity, and a spectral spectrum of light emitted by the selected light emitting device is out of a normal range.

14. The test apparatus according to claim 10, wherein the determination unit is configured to determine the selected light emitting device as defective in a case where an optical characteristic that is at least one of luminance, chromaticity, and a spectral spectrum of light emitted by the selected light emitting device is out of a normal range.

15. The test apparatus according to claim 11, wherein the determination unit is configured to determine the selected light emitting device as defective in a case where an optical characteristic that is at least one of luminance, chromaticity, and a spectral spectrum of light emitted by the selected light emitting device is out of a normal range.

16. The test apparatus according to claim 12, wherein the determination unit is configured to determine the selected light emitting device as defective in a case where an optical characteristic that is at least one of luminance, chromaticity, and a spectral spectrum of light emitted by the selected light emitting device is out of a normal range.

17. The test apparatus according to claim 13, wherein the determination unit is configured to use, as the normal range, a range based on a statistic according to the optical characteristic of light emitted by the at least one light emitting device to be subjected to the light emission processing.

18. The test apparatus according to claim 14, wherein the determination unit is configured to use, as the normal range, a range based on a statistic according to the optical characteristic of light emitted by the at least one light emitting device to be subjected to the light emission processing.

19. A test method comprising:
electrically connecting an electrical connection unit to a terminal of each of a plurality of light emitting devices to be tested;
collectively irradiating the plurality of light emitting devices with light;
measuring a photoelectric signal which is obtained by photoelectrically converting irradiated light by each of the plurality of light emitting devices;
causing at least one light emitting device to be subjected to light emission processing to emit light;
measuring light emitted by the at least one light emitting device to be subjected to the light emission processing; and
determining a quality of each of the plurality of light emitting devices on a basis of both a measurement result of the measuring of a photoelectric signal and a measurement result of the measuring of light, wherein the collectively irradiating the plurality of light emitting devices is with light external from the plurality of light emitting devices.

20. A non-transitory computer-readable storage medium having stored thereon a program that is executed by a test apparatus for testing a plurality of light emitting devices, the program causing the test apparatus to execute:
electrically connecting an electrical connection unit to a terminal of each of a plurality of light emitting devices to be tested;
collectively irradiating the plurality of light emitting devices with light;
measuring a photoelectric signal which is obtained by photoelectrically converting irradiated light by each of the plurality of light emitting devices;
causing at least one light emitting device to be subjected to light emission processing to emit light;
measuring light emitted by the at least one light emitting device to be subjected to the light emission processing; and
determining a quality of each of the plurality of light emitting devices on a basis of both a measurement result of the measuring of a photoelectric signal and a measurement result of the measuring of light, wherein the collectively irradiating the plurality of light emitting devices is with light external from the plurality of light emitting devices.

* * * * *